United States Patent [19]

Swain

[11] 4,074,233
[45] Feb. 14, 1978

[54] SELECTION SWITCH MEMORY CIRCUIT

[75] Inventor: Richard Slaughter Swain, Des Plaines, Ill.

[73] Assignee: Norlin Music, Inc., Lincolnwood, Ill.

[21] Appl. No.: 701,391

[22] Filed: June 30, 1976

[51] Int. Cl.² ............................................. H04Q 9/00
[52] U.S. Cl. ...................... 340/147 LP; 340/152 R; 84/1.01
[58] Field of Search ............ 340/147 LP, 162, 152 R; 84/1.01, 1.24; 307/252 K

[56] References Cited

U.S. PATENT DOCUMENTS

| | | | |
|---|---|---|---|
| 2,995,729 | 8/1961 | Steele | 340/147 LP |
| 3,660,683 | 5/1972 | Wangard | 307/252 K |
| 3,803,594 | 4/1974 | Klein | 340/409 |
| 3,818,447 | 6/1974 | Craft | 340/147 LP |
| 3,833,884 | 9/1974 | Bigbie | 340/147 LP |

*Primary Examiner*—Harold I. Pitts

[57] ABSTRACT

A selection switch memory circuit having a priority encoder for providing a code for the highest priority actuated one of a plurality of momentary contact selection switches, a memory for storing the code and a decoder for providing a select signal on one of a plurality of outputs thereof to activate a circuit corresponding to the stored code. A control includes a comparator to determine if the provided code is the same as the stored code. In one embodiment, if the provided and stored codes are the same, the memory is cleared of the stored code, and the circuit corresponding thereto is deactivated. In another embodiment, the decoder is disabled to terminate activation of the previously selected circuit if the provided and stored codes are the same. In both embodiments, if the provided and stored codes are different, the provided code is entered into the memory in lieu of the stored code. Response of the control to switch actuation is delayed to avoid deleterious effects of switch contact bounce.

35 Claims, 5 Drawing Figures

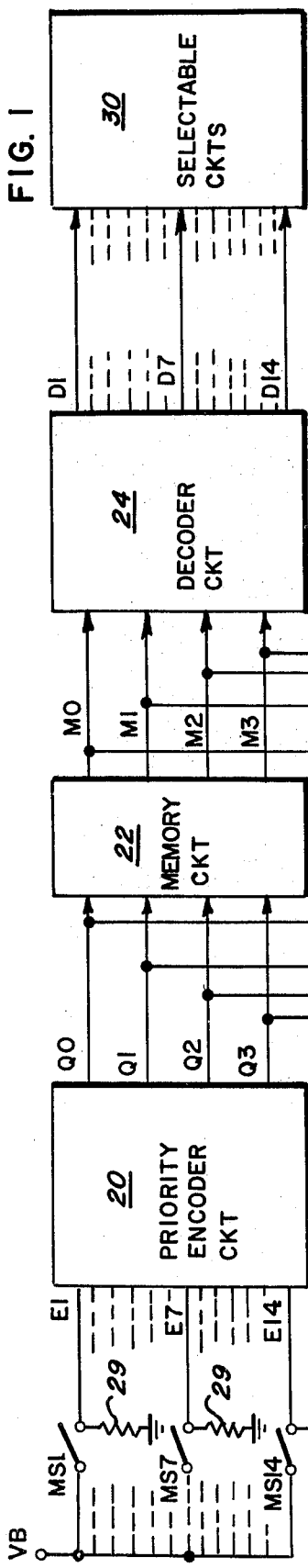
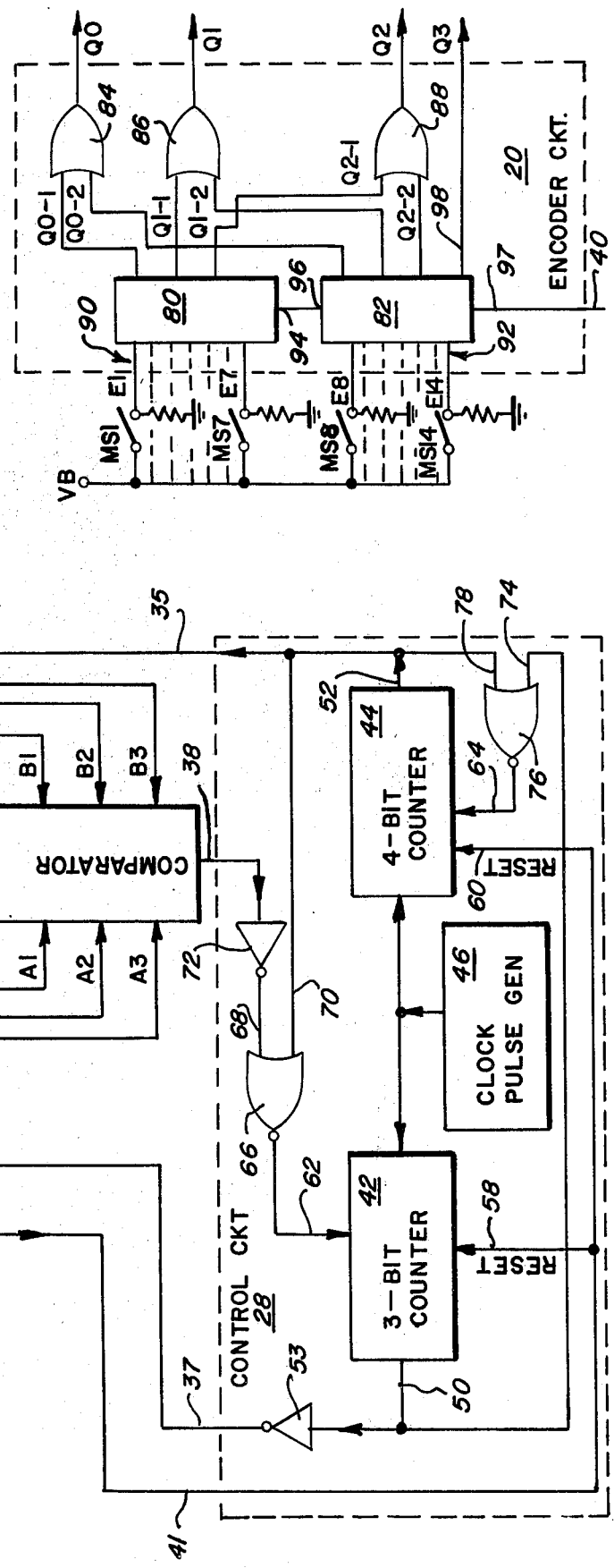

SELECTION SWITCH MEMORY CIRCUIT

BACKGROUND OF THE INVENTION

The present invention relates to a circuit for activating one of a plurality of circuits in response to momentary actuation of a selection switch associated therewith and, more particularly, to such a circuit in which activation of a circuit is automatically terminated both in response to actuation of its associated selection switch or actuation of the selection switch of any other of the plurality of selectable circuits.

In numerous applications it is desired to selectively activate any one, but only one, of a plurality of selectable circuits. For example, in an electronic organ, a plurality of voicing circuits are often provided, each one of which alters the played tones differently to simulate the sounds of different musical instruments, such as a guitar, trumpet, etc. In such a case, it is desirable to enable the organist to easily change his selection from one voicing circuit to another and to terminate any one selection without choosing another so that none of the voicing circuits are activated.

Mechanical switch assemblies are known having a mutually exclusive interlock feature which automatically causes release of any actuated switch upon actuation of any other selector switch of the assembly. Unfortunately, such switch assemblies are relatively expensive and are prone to failure due to mechanical wear, fatigue, etc. Furthermore, a separate actuator is often required to release an actuated switch by means other than making another selection.

Electronic circuits analogous to the mechanical switch assemblies noted above are known which use a separate electronic memory for each switch to maintain actuation of the circuit associated therewith after release of the selector switch. This enables the use of relatively inexpensive momentary contact switches, but the resultant reduction in cost is partially offset by the cost of multiple memories.

Circuits of this type have other disadvantageous qualities which detract from their utility. Often steering networks and other circuitry having a high component count are required to control the plurality of memories in accordance with switch actuation which further adds to complexity and cost. Further, such circuits are also disadvantageously susceptible to switch contact bounce resulting in a single operator actuation of a switch successively setting and resetting in succession a memory associated therewith. Moreover, known circuits employing momentary contact switches and individual memories require the use of an additional circuit associated with a cancelling switch to terminate activation of all multiple circuits. An example of such a selector circuit is shown in U.S. Pat. No. 3,660,683 of Wangard issued May 2, 1972, to Walter E. Heller & Company.

SUMMARY OF THE INVENTION

The foregoing disadvantages of the known selection switch devices are substantially overcome and other improvements realized in the selection switch memory circuit of the present invention. Unlike known circuits, a single memory is employed to selectively control activation of all of the plurality of selectable circuits in accordance with actuations of an associated plurality of selection switches. The memory permits use of relatively inexpensive momentary contact switches, and yet, because there is only one memory, does not itself significantly add to the cost of the selection circuit. The memory and circuitry ancillary thereto is controlled such that actuation of a selection switch associated with a circuit already activated results in deactivation of the circuit. This eliminates the need for a separate cancellation switch. Actuation of the selection switch of a non-activated circuit, in addition to causing activation of that circuit, also automatically causes the deactivation of the previously activated circuit.

In the illustrative embodiments described in detail hereinafter, each selection switch is assigned a binary code by an encoder which provides that code to the memory during actuation of the switch. A comparator compares the provided code with the code stored in the memory. If the provided and stored codes are the same, thus indicating that the selectable circuit represented by the code is in an activated state, a control circuit responsive to the comparator causes deactivation of the circuit. In one embodiment, the memory is cleared and a decoder incapable of decoding the memory in a cleared condition terminates an activation signal required for the circuit to remain activated. In another embodiment in which a decoder is used that is capable of decoding all possible conditions of the memory, the decoder is disabled in response to the provided and stored codes being the same. If the provided and stored codes are different, indicating a new selection, the code representative of the new selection is entered into the memory in lieu of the previous code. The decoder thereby terminates the activation signal for the circuit represented by the previously stored code and applies an activation signal to the selectable circuit represented by the code newly entered into the memory.

An advantageous feature of the selection switch memory circuit is that the encoder includes means for establishing a priority order for the various selection switches connected therewith, and in the event of simultaneous actuation of two or more selection switches, provides the code for only the one actuated switch of highest priority.

Another advantageous feature of the present invention is that control circuitry causing activation and deactivation of the selectable circuits is provided with means for delaying its response to switch actuation by a sufficient length of time to prevent switch contact bounce from causing undesirable successive activations and deactivations of the circuit associated with the switch.

The foregoing advantageous features will be described in more detail and further features of the invention will be made apparent in the following description of the preferred embodiments.

BRIEF DESCRIPTION OF THE DRAWING

The description of the preferred embodiments will be given with reference to the several views of the drawing in which:

FIG. 1 is a schematic, partially in block form, of one embodiment of the selection switch memory circuit of the present invention;

FIG. 2 is a schematic, also partially in block form, of the priority encoder circuit block of FIG. 1;

DESCRIPTION OF THE PREFERRED EMBODIMENTS

Figure 3:
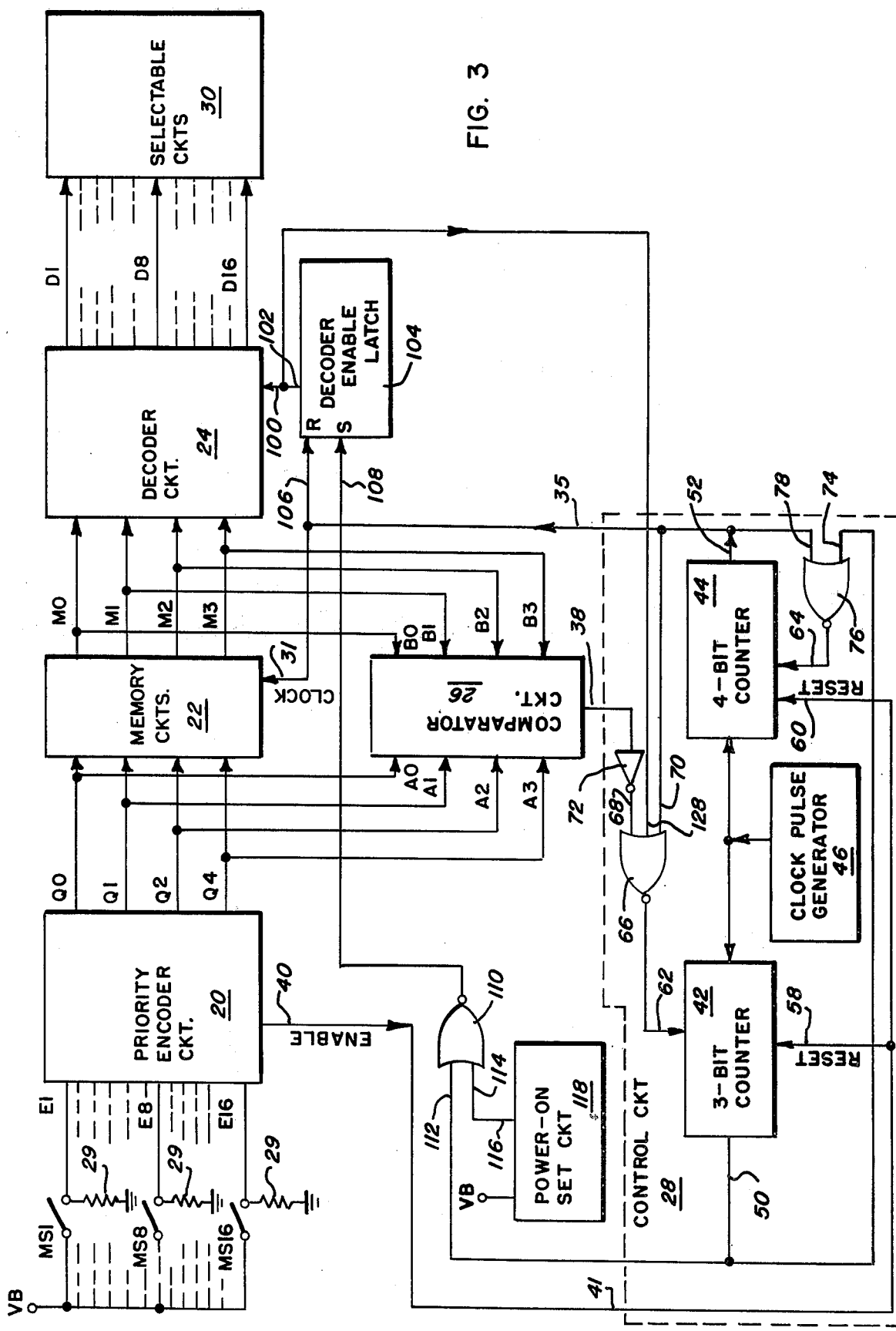
FIG. 3 is a schematic, partially in block form, of another embodiment of the invention.

Referring to FIG. 1 of the drawings, one illustrative embodiment of the selection switch memory circuit or selection circuit is seen to include a priority encoder circuit 20, a memory circuit 22, a decoder circuit 24, a comparator circuit 26, and a control circuit 28. Briefly, the functional relationship between the circuit block of the selection circuit is as follows: The priority encoder circuit 20 encodes selection information from fourteen selection switches MS1–MS14. The memory circuit 22 stores the encoded selection information under control of the control circuit 28. The control circuit 28 responds to signals from comparator circuit 26 and the priority encoder circuit 20 to perform its control function. The decoder circuit 24 decodes the stored selection information to provide an activate signal on the appropriate one of fourteen outputs D1–D14 to activate the selectable circuit 30 connected therewith. Where a set of mutually exclusive selectable circuits 30 are to be controlled, only one of the selectable circuits 30 is connected with each of the decoder outputs. In other applications, a plurality of selectable circuits 30 could be controlled by any one decoder output. The selectable circuits 30 do not form part of the invention and may be any tupe of circuits designed to be selectively activated.

Manual selection is achieved through operation of selection switches MS1–MS14. A source of positive DC voltage VB is connected to one side of each of selection switches MS1–MS14 and the other side of each switch is connected through a bias resistor 29 to ground. Accordingly, whenever one of the selection switches MS1–MS14 is closed, a positive DC voltage or logic 1-state select signal is applied to the one data input of the priority encoder 20 connected therewith.

The selection switches MS1–MS14 are preferably of the momentary contact type and only provide select signals to the data inputs E1–E14 while being held closed. Each of the selectable circuits 30, on the other hand, remain activated only while being provided with an activate signal. As will be explained, through operation of the memory circuit 22, the selection circuit functions to continue to provide an activation signal on an output of decoder circuit 24 after momentary closure of the associated selection switch has terminated. The activation signal is maintained until the same selection switch is actuated again or a different selection switch is momentarily actuated.

When a select signal is applied to any one of inputs E1–E14, the priority encoder circuit 20 provides a four-bit binary number code on its outputs Q0, Q1, Q2, and Q3 representative of that input which is stored by memory circuit 22. Preventing erroneous code generation resulting from simultaneous actuation of two or more selection switches, the priority encoder establishes a priority order for its inputs and thus for the selection switches connected therewith. The data inputs E1–E14 are numerically ordered in descending priority order with data input E1 being of highest priority. If two or more selection switches are simultaneously actuated, the priority encoder circuit 20 ignores all the select signals except the one applied to the input of highest priority. For example, if selection switches MS3, MS7, and MS14 are simultaneously actuated, only the binary code for data input lead E3 will be provided on output Q0–Q3. Preferably the code for each of the data input leads E1–E4 is a binary representation of its number designation. For example, the binary number 0111 (representing the number seven) will be provided on outputs Q3–Q0, respectively, in response to a 1-state signal being applied to input E7.

The code stored in memory circuit 22 is provided on its outputs M0, M1, M2, and M3 and applied to the decoder circuit 24. If the stored code is one not decodeable by the decoder circuit 24, (e.g. the code of 0000 provided when the memory circuit 22 is cleared) an activate signal is not generated on any of the decoder outputs. Decoder outputs D1–D14 are respectively associated with data inputs E1–E14 of the priority encoder. A select signal on any encoder input results in a decodeable code and applicaiton or termination of an activate signal on the associated decoder output.

Control of activation and deactivation of the selectable circuits 30 is thus achieved by controlling data entry and clearing of memory circuit 22. This control is achieved through operation of control circuit 28 cooperating with comparator circuit 26. Briefly, depending upon whether the code generated by the priority encoder circuit 20 is the same as one presently stored in memory circuit 22 or not, the memory in circuit 22 is either cleared of its stored code or a new code is entered.

The memory circuit 22 has two control inputs: a clock input 31 and a clear input 33 respectively connected with outputs 35 and 37 of control circuit 28. If the code applied to the data inputs of memory circuit 22 is differemt than the code stored therein during actuation of one of the selection switches, the control circuit 28 generates a clock pulse on its output 35. The code being provided on encoder outputs Q0–Q3 when this clock pulse is applied to clock input 31 is entered into the memory circuit 22 in lieu of the previously stored code. If the code provided by priority encoder circuit 20 is the same as the code stored in memory circuit 22 during actuation of a selection switch, the control circuit 28 generates a clear signal on its outputs 37. The memory circuit 22, in response thereto, assumes a cleared condition in which 0-state signals are provided on all outputs Q0–Q3. Thus, actuation of a selection switch for a selectable circuit 30 in an inactive state results in activation of that circuit and deactivation of any previously activated circuits, if any. Also, actuation of a selection switch for a selectable circuit 30 which is already in an active condition, deactivates that circuit.

Determination of whether an actuated selection switch is one represented by the stored code or not is made by comparator circuit 26. Comparator circuit 26 has four comparing inputs A0, A1, A2, and A3 connected with the four inputs of memory circuit 22 respectively coupled to priority encoder outputs Q0–Q3, and four comparing inputs B0, B1, B2, and B3 connected with memory circuit outputs M0–M4, respectively. The comparator 26 compares the input and output codes of memory circuit 22 on a bit-by-bit basis. If input pairs A0 and B0, A1 and B1, A2 and B2, and A3 and B3 are in the same logic states, a 1-state true compare signal is generated on its output 38. This indicates to the control circuit 28 that the code being provided by priority encoder 20 is the same code as the one previously stored in memory circuit 22. If any one pair of comparing inputs are in opposite logic states, a 0-state false compare signal is provided on output 38 to indicate that a new selection has been made.

If the control circuit 28 is enabled, it appropriately responds to the compare signal to either clear or clock the memory circuit 22. Priority encoder circuit 20 generates a 0-state enable or start signal on an output 40 thereof in response to a select signal being applied to any of the date inputs E1–E14. Output 40 is connected with an enable input 41 of control circuit 28, and only when a 0-state signal is applied thereto is the control circuit 28 enabled to generate either clear or clock output pulses. When none of the momentary contacts switches MS1–MS14 is closed, a 1-state signal is provided on output 40.

The control circuit 28 includes a 3-bit binary counter 42, a 4-bit binary counter 44, and a clock pulse generator 46. In keeping with one aspect of the invention, these three elements cooperate to provide a delayed response to the enable signal from priority encoder 20. The delayed response prevents an even number of successive switch closures due to switch contact bounce from undesireably resulting in clearing the memory circuit 22 of a code to be entered into storage.

Clock pulse generator 46 continuously provides a pulse train at a selected frequency which is applied to both a clock input 26 of 3-bit counter 42 and clock input 48 of 4-bit counter 44. When enabled, each counter is incrementally advanced one count in response to each pulse of the pulse train. The 3-bit counter 42 generates a 1-state signal on an output 50 thereof in response to being advanced four times while the 4-bit counter 44 provides a 1-state signal on an output 52 thereof only after counting eight clock pulses. Signals on output 50 are inverted by an inverter 53 and applied through control circuit output 37 to the clear input 33 of memory circuit 22. The output signals form 4-bit counter 44 are directly applied to clock input 31 of memory circuit 22.

Control of the memory circuit 22 is achieved through control of the 3-bit counter 42 and the 4-bit counter 44. The 3-bit counter has a reset input 58 and is enabled to increment in response to the pulse train from clock pulse generator 46 only when a 0-state signal is applied thereto. Likewise, the 4-bit counter 44 has a reset input 60 and will only advance when a 0-state signal is being provided thereto. Counters 42 and 44 are reset to a count of zero each time a 1-state reset signal is applied to the reset inputs thereof.

Both reset input 58 and 60 are coupled to the enable output 40 of priority encoder 20. Consequently, with none of the momentary contact switches MS1–MS14 in a closed state, the 1-state signal provided on enable output 40 resets both counters 42 and 44 and disables them from incrementing in response to the pulse train from the clock pulse generator 46. When any one of more of the selection switches MS1–MS14 is closed, however, the 0-state enable signal terminates disablement of both counters 42 and 44. When the output enable signal is generated, the 3-bit counter 42 alone commences counting or both counters 42 and 44 commence counting depending upon whether a 1-state true compare or a 0-state false compare signal is being presented on comparator output 38.

The condition of comparator output 38 determines whether the 3-bit counter 42 is enabled to count. The 3-bit counter 42 is incremented in response to clock pulses only if a 1-state signal is applied to an enable input 62 thereof. A 1-state enable signal is applied to enable 3-bit counter 42 only if a true compare signal is being generated. Enable input 62 is coupled to the output of a NOR gate 66. One input 68 of NOR gate 66 is connected with the output 38 of comparator 26 through an inverter 72 and another input 70 is connected to the output 52 of 4-bit counter 44. Initially, the 4-bit counter output 52 is in a 0-state. Accordingly, the output state of NOR gate 66 is determined solely by the logic state of its input 68 connected with comparator circuit 26.

If the code stored in memory circuit 22 is the same as that provided on the output of priority encoder 20, then the 1-state true compare signal results in the application of 0-state signal to input 68 of NOR gate 66. The NOR gate 66 in response thereto applies a 1-state enable signal to 3-bit counter 42. The 3-bit counter 42 is thus allowed to advance in response to clock pulse generator 46. When a count of four is reached, a 1-state signal is generated thereby, inverted by inverter 52 and applied to clear input 54 to clear memory circuit 22 of the stored code.

Once the memory circuit 22 is cleared a true comparison is lost and comparator output 38 switches to a 0-state. As a result the 3-bit counter 42 is disabled from counting further clock pulses, and a 1-state signal remains on counter output 50 until the counter is reset.

The 1-state clear signal on output 50 is also coupled to an input 74 of a NOR gate 76 to disable 4-bit counter 44. NOR gate 76 has its output connected to enable input 64 of 4-bit counter 44, and second input 78 thereof is coupled to the output 52 of 4-bit counter 44. When the clear signal is generated, the output of NOR gate 76 and thus enable input 64 is caused to switch to a 0-state. The 4-bit counter 44 is enabled to respond to the clock pulse generator 46 only when a 1-state enable signal is applied to an enable input 64 thereof. The 4-bit counter 44 is thereby disabled from counting further clock pulses to prevent generation of the memory clock signal. When the momentary contact switch which has been actuated is released and opened, enable output 40 returns to a 1-state, and both counters 42 and 44 are reset to a count of zero. Both counters 42 and 44 remain in this condition until the next selection switch actuation.

It should be appreciated that in accordance with one of the objects of the invention, delaying generation of the clear signal a preselected time period after generation of the group select signal serves the purpose of avoiding deleterious effects of switch contact bounce. The contacts of momentary contact switches of the type contemplated for use as the selection switches MS1–MS14 will frequently bounce apart and reclose in response to a single actuation. If a clear signal were generated immediately in response to the enable output signal, the first closure of the contacts would cause the memory circuit to be cleared, and the second closure would result in generation of a memory clock signal and re-entry into storage of the same code previously stored. In a like manner switch contact bounce could result in entry and immediate removal of code for a new circuit selection.

In control circuit 28, however, the frequency of clock pulse generator is selected so that the time delay occassioned by the 3-bit counter 42 is longer than the naturally occurring period of momentary contact closure during contact bounce. Should the contact bounce open before the end of the time period, the counters 42 and 44 are merely reset and response to bounce contact is thereby avoided. The contacts must close and remain closed for the preselected time period in order for a clear signal to be generated. The necessary time delay of course depends on the bounce characteristics of the particular switches that are employed. However, the delay established by driving a 3-bit counter with a clock pulse at a frequency of approximately 220 Hz has been found suitable.

If a switch is actuated having a code different from that stored in memory circuit 22, the false compare signal causes the 3-bit counter 42 to be disabled. Accordingly, the 3-bit counter 42 never reaches a count of four to disable the 4-bit counter 44. Consequently, the 4-bit counter 44 continues to respond to the pulse train after a count of four, and upon being incremented eight times, the counter output 52 switches to a 1-state. The resultant positive transition appearing on clock input 31 of memory circuit 22 causes the provided code to be entered into storage in lieu of the previously stored code, if any.

The 1-state signal from 4-bit counter output 52 is applied to an input 78 of NOR gate 76. The NOR gate 76 in response thereto switches its output to a 0-state to disable 4-bit counter 44 from further activity until reset. The application of the 1-state signal on output 52 to input 70 of NOR gate 66 also assures that the 3-bit counter 42 will not be enabled in response to the true compare signal developed upon entry of the new code into the memory circuit 22. The condition of the two counters 42 and 44 remains stable until reset by loss of the output enable signal.

A number of conventional circuits may be used for each of the functional circuit blocks of the selection switch memory circuit of FIG. 1 which will perform the required functions in the manner described. The present invention does not reside in the details of such circuits. Accordingly, for brevity's sake a description of detailed circuitry is not provided. However, a unit was constructed employing integrated circuit packages indicated below which operated successfully and reference may be had to McMOS Integrated Circuits DATE BOOK, first edition, published by Motorola Semiconductor Products, Inc., 1973, (McMOS book) and "CMOS Integrated Circuits", March, 1975 edition, published by National Semiconductor Corporation, (CMOS book) if further information concerning the operating characteristics and circuitry of the various circuit blocks is desired.

| Ref. No. | Label | Trade Designation | Reference Book |
|---|---|---|---|
| 20 | Priority Encoder Ckt | Motorola MC14532 | McMOS, P. 7–208 |
| 22 | Memory Ckt | National MM74C175 | CMOS, p. 70 |
| 24 | Decoder Ckt | National MM74C154 | CMOS, p. 32 |
| 26 | Comparator Ckt | National MM74C85 | CMOS, p. 32 |
| 42 | 3-bit Counter | Motorola MC14520 | McMOS, p. 7–168 |
| 44 | 4-bit Counter | Motorola MC14520 | McMOS, p. 7–168 |

The priority encoder 20 is likewise readily constructed from two 8-bit priority encoders 80 and 82 and three NOR gates 84, 86, and 88 as shown in FIG. 2. The two 8-bit priority encoders 80 and 82 are identical and each may comprise and integrated circuit such as integrated circuit MC14532 made by Motorola Semiconductor Products, Inc., (see McMos book, p. 7-208). Data inputs E1–E7 of priority encoder circuit 20 are respectively connected with seven data inputs 90 of encoder 80 and inputs E8–E14 are respectively connected with seven data inputs 92 and encoder 82. The enable output 40 of priority encoder circuit 20 is taken directly from an enable output 97 of encoder 82. Encoder 80 has three outputs Q0-1, Q1-1, and Q2-1 on which are generated a binary number code corresponding to the highest priority activated one of its inputs 90. Encoder 82 likewise has three outputs Q0-2, Q1-2, and Q2-2 on which the binary code for the highest priority activated one of its inputs 92 is provided.

An enable output 94 of encoder 80 is connected with an enable input 96 of encoder 82. Encoder 80 provides a 0-state signal on its enable output 94 whenever a 1-state select signal is applied to any one of its inputs 90, and encoder 82 is enabled to encode only when a 1-state enable signal is applied to its enable input 96. Consequently, 0-state signals are provided on all of the outputs of encoder 82 whenever any one of inputs E1–E7 is actuated. An enable input 83 of encoder 80 is coupled to the positive DC power supply VB to maintain it in an enabled state. Consequently, the appropriate code will always appear on the outputs of encoder 80 whenever a select signal is applied to one of its inputs 90.

Further, encoder 82 generates a 0-state signal of its enable output whenever its enable input 96 is in a 0-state or whenever any of its inputs 92 are in a 1-state. Since a 0-state signal is applied to the enable input 96 whenever a select signal is applied to any of data inputs 90, a 0-state signal is applied to reset inputs 458 and 60 whenever any of the 14 selection switches MS1–MS14 is actuated.

The Q0, Q1, and Q2 outputs of encoder circuit 20 are respectively taken from the outputs of OR gates 84, 86, and 88. OR gate 84 has two inputs respectively connected with Q0-1 and Q0-2 encoder outputs. Likewise, OR gate 86 has its two inputs connected with the Q1-1 and Q1-2 encoder outputs, and the inputs to OR gate 88 are taken from encoder outputs Q2-1 and Q2-2. Whenever one of inputs 90 is provided with a 1-state signal and encoder 82 is thereby disabled, the code provided on outputs Q0–Q2 is identical to that provided on the outputs Q0-1 through Q2-1 of priority encoder 80. When one of inputs 92 is activated and 0-state signals are provided to all of inputs 90, the code provided on outputs Q0–Q2 is identical to the code provided on outputs Q0-2 through Q2-2 of encoder 82.

The encoder circuit output Q4 is taken from a group select output 98 of encoder 82. Encoder 82 functions to generate a 1-state signal on its group select output 98 when any one of its inputs 92 is selected. Thus, a 1-state signal on output Q4 indicates that the code being provided on outputs Q0–Q2 is that developed by priority encoder 82 in response to actuation of one of inputs E8-E14, and a 0-state signal indicates the signals on outputs Q0–Q4 are developed in response to actuation of one of selection switches MS1–MS7.

Figure 4:
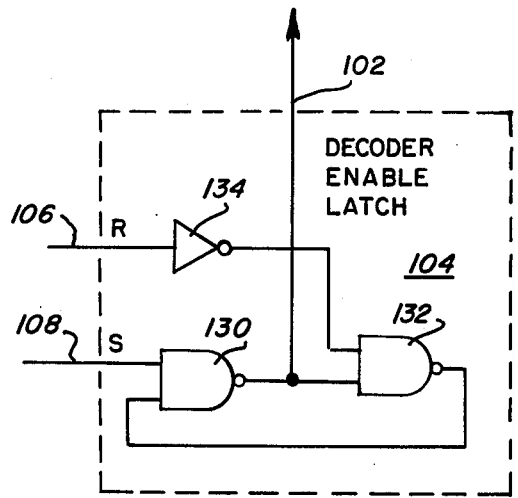
FIG. 4 is a schematic of the decoder enable block of the selection switch memory circuit embodiment of FIG. 3.
Figure 5:
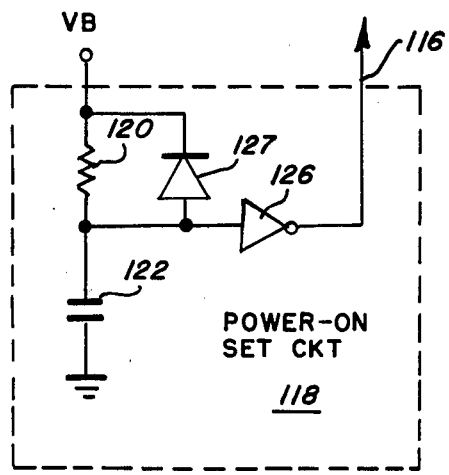
FIG. 5 is a schematic of the power-on reset block of the embodiment of FIG. 3.

Referring now to FIGS. 3, 4, and 5, another embodiment of the selection memory circuit will be described. The embodiment of FIG. 3 is very similar to that of FIG. 1 both in operation and structure. The circuit elements of FIG. 3 corresponding to those of FIG. 1 have been given the same reference numeral. Unless otherwise indicated in the following description, these corresponding elements operate in an identical fashion in both circuit embodiments. Accordingly, description will only be given of the circuit elements of FIG. 3 differing from the embodiment of FIG. 1.

The principle difference between the two circuit embodiments resides in the manner in which a selectable circuit 30 is deactivated in response to actuation of its associated selection switch. In the circuit of FIG. 1, in which one nondecodeable code is needed for deactivation of all selectable circuits, a number up to, but no greater than, fifteen of the possible sixteen codes can be used for activation. In the circuit of FIG. 3, deactivation of a selectable circuit 30 is achieved by disablement of decoder circuit 24 rather than by entering a nondecodeable code into memory circuit 22. Advantageously, this enables using decoder circuit 24 to its full capacity to decode all possible code combinations of a 4-bit code. Accordingly, as seen in FIG. 3, priority encoder circuit 20 is provided with 16 inputs E1–E16 rather than only 14 inputs, and activate signals are selectively provided on each of sixteen outputs D1–D16 of decoder circuit 24.

In particular, this increased capability can be obtained by using the same integrated circuit encoders 80 and 82 and the same decoder circuit 24 as used in the circuit of FIG. 1. This avoids the increased cost of additional integrated circuits for these two functions. Other circuitry is required but the cost of this other circuitry is substantiallly less than that of the encoder and decoder integrated circuit which would otherwise be required. Thus, the circuit embodiment of FIG. 3 is preferred over that of FIG. 1 if the greater capacity is required.

Decoder circuit 24 has a strobe input 100, and a 0-state enable signal must be applied thereto in order for the decoder circuit 24 to respond to any of the sixteen possible input codes and provide an activate signal on the appropriate one of its sixteen outputs D1–D16. When a 0-state enable signal is applied to strobe input 100, the decoder input circuit 24 will generate an activate signal on the one output thereof corresponding to the code from memory circuit 22 including the codes of 0000 and 1111.

Strobe input 100 is connected with the normal or Q output 102 of a decoder enable latch 104 which thus determines whether or not the decoder circuit 24 is enabled. When the decoder enable latch 104 is in a set condition a 1-state signal is generated on its output 102 to disable the decoder circuit 24. When in a reset condition the decoder enable latch 104 provides a 0-provides a 0-state signal to strobe input 100 and the decoder circuit 24 is enabled. The decoder latch 104 has a reset input 106 connected with the memory clock output of control circuit 28 and a set input 108 connected with the output of a NOR gate 110. NOR gate 110 has one input 112 connected directly with output 50 of 3-bit counter 42 and another input 114 conencted with the output 116 of a power-on reset circuit 118.

Referring to FIG. 5, the power-on set circuit 118 functions to disable decoder circuit 24 when power is first applied. A resistor 120 and a capacitor 122 are connected in series between ground and the DC power supply VB. When DC power is applied to the selection circuit capacitor 122 is charged through resistor 120. The respective values of resistor 120 and capacitor 122 are selected so that a preselected time period elapses before the charge on capacitor 122 reaches the level corresponding to a logic 1-state. During this period, a 0-state signal at the junction between resistor 120 and capacitor 122 is applied to the input of an inverter 126 which provides a 1-state signal on its output 116 to input 94 of NOR gate 90. A diode 127 conncted across the resistor 120 provides a path for rapid discharge of capacitor 122 when power is turned off. NOR gate 110, in response to this 1-state signal, applies a 0-state signal to set input 108. The decoder enable latch 104 is set in response to the 0-state signal to disable decoder circuit 24.

After the time period established by the RC time constant of resistor 120 and capacitor 122 has elapsed, the input to inverter 126 rises to a 1-state level. When this occurs, output 116 switches to a 0-state to enable NOR gate 110 to respond to a 1-state clear signal. The output of NOR gate 110 remains in a logic 1-state until generation of a clear signal. While the decoder circuit 24 is disabled, the code stored in memory circuit 22 has no effect on activation and may be indeterminent.

In a selection switch is actuated that is represented by the code in memory circuit 22, a true compare signal is generated on output 38 and a 0-state signal applied to input 68 of NOR gate 66. Unlike the circuit of FIG. 1, NOR gate 66 has a third input 128 connected with the normal output 102 of decoder enable latch 104. Accordingly, the NOR gate 66 is disabled from responding to a true compare signal when the decoder circuit 24 is disabled. The 3-bit counter 42 is therefore not enabled to respond to the pulse train rom clock pulse generator 46, and after eight counts thereof, the 4-bit counter 44 generates a clock pulse on its output 52. This clock pulse has no effect on the memory circuit 22 since the same code being presented is the code already stored. However, memory clock output 35 is connected with reset input 106 of decoder enable latch 104 which is reset in response to the clock pulse. Upon being reset, a 0-state signal is applied to strobe input 100 to enable decoder circuit 24 to activate the appropriate selectable circuit 30.

The 0-state enable signal is also applied to input 128 of NOR gate 66 which is thus, after reset of 4-bit counter 44, enabled to respond to a subsequent true compare signal. If a true compare signal is generated, the 1-state signal generated on the output 50 of 3-bit counter 42 is inverted by NOR gate 110 and applied to set input 108 to set decoder enable latch 104 and thereby disable decoder circuit 24.

If false compare signal is generated when the decoder circuit 24 is enabled, the new code is entered into memory circuit 22. The memory clock pulse on output 35 has no effect on decoder enable latch 104 which remains in a reset condition. Thus, decoder circuit 24 remains enabled to activate the appropriate selectable circuit 30 in accordance with the new stored code.

Referring to FIG. 4, the decoder enable latch 104 is seen to comprise a pair of NAND gates 130 and 132 and an inverter 134. The output of NAND gate 130 is coupled to one input of NAND gate 132 and also coupled with the output 102 of the decoder enable latch 104. Another input of NAND gate 132 is taken from the output of the inverter 134, the input of which is reset input 106. The output of NAND gate 132 is connected with the input of NAND gate 130 to achieve latching, and another input to NAND gate 130 is the set input 108. When a 0-state set signal is applied to set input 108, NAND gate 130 switches to a 1-state to disable the decoder circuit 24. The 0-state signal developed by 4-bit counter 44 and applied to reset input 106 is inverted by inverter 134. NAND gate 132 switches its output and the one input to NAND gate 130 to a 0-state to achieve the latching condition.

The decoder enable latch 104 remains latched in the set condition until reset input 106 assumes a 1-state at the end of eight counts of 4-bit counter 44. The resultant 0-state signal applied to the one input of NAND gate 132 causes it to switch to a 3-state. Set input 108 is normally maintained in a 1-state and thus decoder circuit 24 and to reset the decoder enable latch 104 through operation of NAND gate 130.

While two particular embodiments have been described in detail, it should be appreciated that these embodiments are only illustrative and numerous changes may be made in circuit details without departing from the conceptual approach employed to achieve the desired objectives of the switch selection memory circuit. For instance, while binary counters are employed to establish a delayed response, ring counters or other delay means could perform the same function. Likewise, while binary coding and a latch memory circuit have been disclosed other coding and storage means could be successfully used. Similarly, capacitive type or other electronic switches could be used in lieu of the disabled mechanical contact switches.

I claim:

1. In a selection circuit having a plurality of actuateable swtiches and a plurality of selectable circuits associated therewith, a switching circuit for selectively activating said selectable circuits, comprising:
   means for providing a code representative of any one of said switches in response to actuation thereof;
   storage means for storing the provided code;
   means for comparing the stored code with a subsequently provided code; and
   means responsive to said comparing means for controlling activation of said selectable circuits, said controlling means deactivating an activated one of said selectable circuits in response to the provided code being the same as the stored code.

2. The switching circuit of claim 1 wherein said code providing means includes
   means for establishing a priority order for said plurality of actuateable switches, and
   means for generating a code for only the one actuated switch of highest priority, only one code being stored by said storing means at a time.

3. The switching circuit of claim 1 in which
   the storing means has an input at which the provided code is applied and an output at which the stored code is provided,
   said comparing means includes a comparator with first and second inputs respectively connected with the input and output of the storing means, said comparator generating a true compare signal in response to the code at said first input being the same as the code at its second input, and wherein said controlling means includes
      means for activating the selectable circuit represented by a stored code only during storage of the code, and
      means responsive to said true compare signal during actuation of a switch for clearing the storing means of the stored code.

4. The switching circuit of claim 3 in which the code provided by said code providing means is a multiple bit binary code and said comparator compares the codes applied to its two inputs on a bit-by-bit basis, generating said true compare signal only when each one of the multiple bits of the code applied to one input is in the same binary logic state as the corresponding bit applied to its other input.

5. The switching circuit of claim 3 in which
said comparator generates a false compare signal whenever the code at one of its inputs is not the same as the code applied to its other input, and
said controlling means includes means responsive to the false compare signal for generating a memory clock signal, said storing means in response to said memory clock signal receiving for storage the provided code.

6. The switching circuit of claim 3 in which said clearing means includes
   means for generating a start signal in response to actuation of any one of the plurality of switches, and
   means for generating a clear signal in response to continuous generation of the start signal for a preselected time period, said clear signal being generated at the end of the preselected time period, and
   means responsive to generation of said true compare signal for enabling said clear signal generating means, said clear signal generating means generating said clear signal only when enabled.

7. The switching circuit of claim 6 in which at least one of said plurality of switches is susceptible to contact bounce upon manual actuation, and said preselected time period is greater than the naturally occuring period of contact closures during said switch contact bounce.

8. The switching circuit of claim 6 wherein said clear signal generating means includes
   means for generating a pulse train and
   means for counting the pulses of the pulse train, said counting means generating said clear signal in response to reaching a preselected count and resetting to a count of zero in response to termination of said start signal, said counting means being enabled to count only when a true compare signal is being provided.

9. The switching circuit of claim 1 in which said comparing means includes a comparator with first and second inputs respectively connected with the input and output of the storing means, said comparator generating a false compare signal in response to the code at the first input being different from the code at the second input, and
   said controlling means includes
      means responsive to the false compare signal to enter the provided code into the storing means, and
      means responsive to the stored code for activating the selectable circuit represented thereby.

10. The switching circuit of claim 9 in which
said controlling means includes means for generating a start signal in response to actuation of any one of the plurality of switches,
   means for generating a memory clock signal a preselected time period after generation of said start signal, said memory clock signal being applied to said storing means to cause entry of the provided code therein, and
   means for disabling the memory clock pulse generating means in response to provision of said false compare signal.

11. The switching circuit of claim 10 in which at least one of said plurality of switches is susceptible to switch contact bounce and said preselected time period is longer than the natural occuring time period of intermittant contact during switch contact bounce.

12. The switching circuit of claim 10 wherein said controlling means includes means for generating a pulse train,
means for counting the pulses of the pulse train when enabled, and
means for resetting the counting means to a count of zero in response to termination of the start signal, said counting means generating said memory clock pulse upon reaching a preselected count.

13. The switching circuit of claim 10 in which
said comparator generates a true compare signal in response to the code being applied to one of its inputs being the same as the code applied to its other input and
said controlling means includes
means for generating a clear signal in response to said true comparison signal to clear the memory of the stored code, and
means for disabling the clock memory pulse generating means in response to said clear signal.

14. The switching circuit of claim 9 in which
said comparator generates a true compare signal in response to the code at its first input being the same as the code at its second input, and
said controlling means includes means responsive to the true compare signal for disabling the activating means.

15. The switching circuit of claim 14 wherein
said activating means comprises a decoder with a plurality of outputs respectively connected with the plurality selectable circuits, said decoder applying a select signal on the one output connected with the selectable circuit represented by the stored code to activate said circuit except when disabled, and
said disabling means in response to the true compare signal disables said decoder from applying a select signal on any of its outputs whereby all of said selectable circuits are placed in a deactivated state.

16. In a switching circuit having a plurality of actuateable switches, a switch selection memory, comprising:
means for providing a code for an actuated one of the plurality of switches;
a memory for storing the provided code;
means for comparing a stored one of the codes with the provided code including
means for generating a true compare signal in response to the provided code being the same as the stored code, and
means for generating a false compare signal in response to the provided code and stored code being not the same;
means for providing an output signal indicative of switch selection including means for generating an output signal indicative of the stored code; and
means responsive to the comparing means for controlling the output signal providing means including
means for entering the provided code into the memory in response to the false compare signal, and
means responsive to the true compare signal for preventing generation of an output signal indicative of any of the switches.

17. The switching circuit of claim 16 in which said output signal preventing means includes means for clearing the memory in response to the true compare signal.

18. The switching circuit of claim 16 in which said output signal preventing means generates a clear signal in response to said true compare signal and said controlling means includes means for disabling the code entering means in response to said clear signal.

19. The switching circuit of claim 16 wherein
the code entering means generates a memory clock signal in response to said false compare signal, said memory in response to said clock signal receiving for storage the provided code, and
said controlling means further includes means responsive to the clock memory signal for disabling the output signal preventing means.

20. The switching circuit of claim 19 in which
said clearing means includes means for generating a clear signal in response to the true compare signal, said output signal preventing means clearing the memory in response to the clear signal, and
said controlling means includes means for disabling the memory clock signal generating means in response to said clear signal.

21. The switching circuit of claim 19 in which said output signal generating means comprises a decoder for decoding the stored code and said output signal preventing means includes means for disabling the decoder in response to the clear signal, said decoder having a plurality of outputs respectively associated with said plurality of switches and, when not disabled, providing a select signal on the one output corresponding to the stored code.

22. The switching circuit of claim 16 in which
said output signal preventing means includes means for generating a clear output signal in response to actuation of any one of the plurality of switches, said preventing means preventing generation of an output signal in response to the clear output signal,
said code entering means includes means for generating a memory clock output signal in response to actuation of any one of the plurality of switches, the provided code being entered into the memory in response to the memory clock signal, and
the controlling means includes
means for disabling one of the clear signal generating means and memory clock output signal generating means in response to generation of the output signal of the other of said clear signal and memory clock signal generating means,
means for enabling the other of the clear signal and memory clock signal generating means in response to generation of a selected one of the comparing means output signals, said other one of the clear signal and memory clock signal output generating means, when enabled, generating an output signal in response to actuation of any one of said switches after a preselected first time delay, and
means responsive to the output signal of said other of the clear signal and memory clock signal generating means to disable the one of the clear signal and memory clock signal generating means, said one of the clear signal and memory clock signal generating means generating an output signal in response to actuation of any one of said switches after a second time delay longer than said first time delay unless disabled before the end of the second time delay.

23. The switching circuit of claim 22 in which said one of said clear signal generating means and memory clock signal generating means is the memory clock signal generating means and the selected one of the comparator output signals is the true compare signal.

24. A priority selection circuit for selectively activating any one of a plurality of selectable circuits, comprising:
   a plurality of actuateable switches respectively associated with the plurality of selectable circuits;
   means for generating a code for each switch including means for establishing a priority order for said switches, said code generating means generating a code representative of only the switch of highest priority during simultaneous actuation of more than one switch;
   means for storing the generated code; and
   means responsive to the stored code for activating the one of the plurality of selectable circuits corresponding thereto.

25. The priority switch selection circuit of claim 24 in which said plurality of actuatable switches comprise momentary contact switches and said code generating means generates the code for a switch only during actuation thereof.

26. The priority switch selection circuit of claim 24 wherein said code generating means comprises a binary encoder having a plurality of outputs and a plurality of inputs respectively connected with said plurality of actuateable switches, said encoder generating different logic states signals on said plurality of outputs representative of a binary code of the one selected input of highest priority, each input being selected through actuation of the swith associated therewith, said encoder also being responsive to selection of one input to prevent generation of the code of any other selected input of lower priority, 27. The priority selection circuit of claim 24 in which said circuit activating means includes means for decoding the stored code, said decoding means having a plurality of outputs respectively coupled to the plurality of selectable circuits, each output being associated with a different code, said decoding means providing a select signal on one of its outputs to activate the circuit associated therewith in response to the code corresponding thereto being stored.

28. The priority selection circuit of claim 24 in which said code generating means includes means for generating a group select pulse in response to actuation of any one of said plurality of switches and said code storing means includes a memory and means responsive to the group select signal for controlling the memory.

29. The priority selection circuit of claim 28 in which said memory controlling means includes
   a comparator for comparing the generated code with the code stored in the memory,
   means responsive to said comparator for clearing the memory,
   means for entering the generated code into the memory in place of the stored code, and
   means responsive to said group select signal for enabling both the memory clearing means and the code entering means.

30. In an electrical musical instrument having a plurality of actuateable selection switches associated with selectable special effects circuits of the instrument, a switching circuit for controlling activation of the special effects circuits, comprising:
   means for providing a representation of one or said selection switches during actuation thereof;
   storage means for storing the representation after actuation of the switch is terminated;
   means responsive to the storage means for activating the circuit associated with the switch represented by the stored representation; and
   means for deactivating the circuit of the switch represented in the storing means in response to the provided representation and the stored representation being of the same switch.

31. The switching circuit of claim 30 in which the selectable special effects circuits are voicing circuits.

32. The switching circuit of claim 30 wherein said deactivating means includes means for disabling said activating means.

33. The switching circuit of claim 30 in which said deactivating means includes means for terminating storage of representation of any of the selectable circuits.

34. The switching circuit of claim 30 wherein said selection switches have a characteristic switch contact closure period during contact bounce, and including means for delaying response of said deactivating means by a delay period greater than said closure period.

35. The switching circuit of claim 30 wherein
   said storage means can store the representation of only one switch at a time, and
   said providing means includes
      means for establishing a priority order for said selection switches, and
      means for preventing response to all but the highest priority one of a plurality of actuated ones of said selection switches.

* * * * *